United States Patent
Perret et al.

(10) Patent No.: US 6,997,720 B2
(45) Date of Patent: Feb. 14, 2006

(54) INTERCONNECTING MODULE FOR THE BASE OF ELECTRONIC EQUIPMENT CASING

(75) Inventors: François Perret, Antony (FR); Gérard Nemoz, Maisons-Alfort (FR); Joël Sabourin, Villebon S/Yvette (FR); Alain Cognard, deceased, late of Antony (FR); by Fabien Cognard, legal representative, Antony (FR); by Jeanine Hugon, legal representative, Antony (FR); by Elodie Cognard, legal representative, Accra (GH)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/451,667

(22) PCT Filed: Dec. 14, 2001

(86) PCT No.: PCT/FR01/03987

§ 371 (c)(1),
(2), (4) Date: Aug. 30, 2004

(87) PCT Pub. No.: WO02/054847

PCT Pub. Date: Jul. 11, 2002

(65) Prior Publication Data

US 2005/0032398 A1    Feb. 10, 2005

(30) Foreign Application Priority Data

Dec. 28, 2000  (FR)  .................................. 00 17227

(51) Int. Cl.
*H01R 12/00*   (2006.01)
*H01R 12/24*   (2006.01)
*H05K 1/00*    (2006.01)

(52) U.S. Cl. ........................... 439/67; 439/62; 439/493
(58) Field of Classification Search .................. 439/67, 439/62, 493, 65, 74; 361/784, 789
See application file for complete search history.

(56) References Cited

U.S. PATENT DOCUMENTS

| | | |
|---|---|---|
| 5,161,986 A | 11/1992 | Gulbranson et al. |
| 5,172,114 A | 12/1992 | Bedoya et al. |
| 5,348,482 A | 9/1994 | Rudy, Jr. et al. |

(Continued)

*Primary Examiner*—Chandrika Prasad
(74) *Attorney, Agent, or Firm*—Lowe Hauptman & Berner, LLP

(57) ABSTRACT

This interconnection module for the base of an electronic device casing carries out the transfer, at the faces of the printed circuit boards (4, 5) supporting the components of the device housed in the casing, of a field of connection points with the external environment of the casing embodied by the rear ends of the pins of a semi-connector fixed to the back of the casing while still retaining the compactness of the casing despite a very large number of connection points with the external environment of the casing (several hundreds of them). This module takes the form of a three-panel structure with a central panel 7 fixed to the rear ends of the pins of the semi-connector (3) mounted on the back of the casing and two side panels (8, 9) folded and placed flat against each other, joined to the longitudinal edges of the central panel (7) by flexible printed circuit elements (10, 11) and supporting the field of connection points transferred to the level of the faces of the boards (4,5) of the electronic device. Electronic connections link the two fields of connection points in going through the joining parts (10, 11).

14 Claims, 3 Drawing Sheets

U.S. PATENT DOCUMENTS

Figure 1:
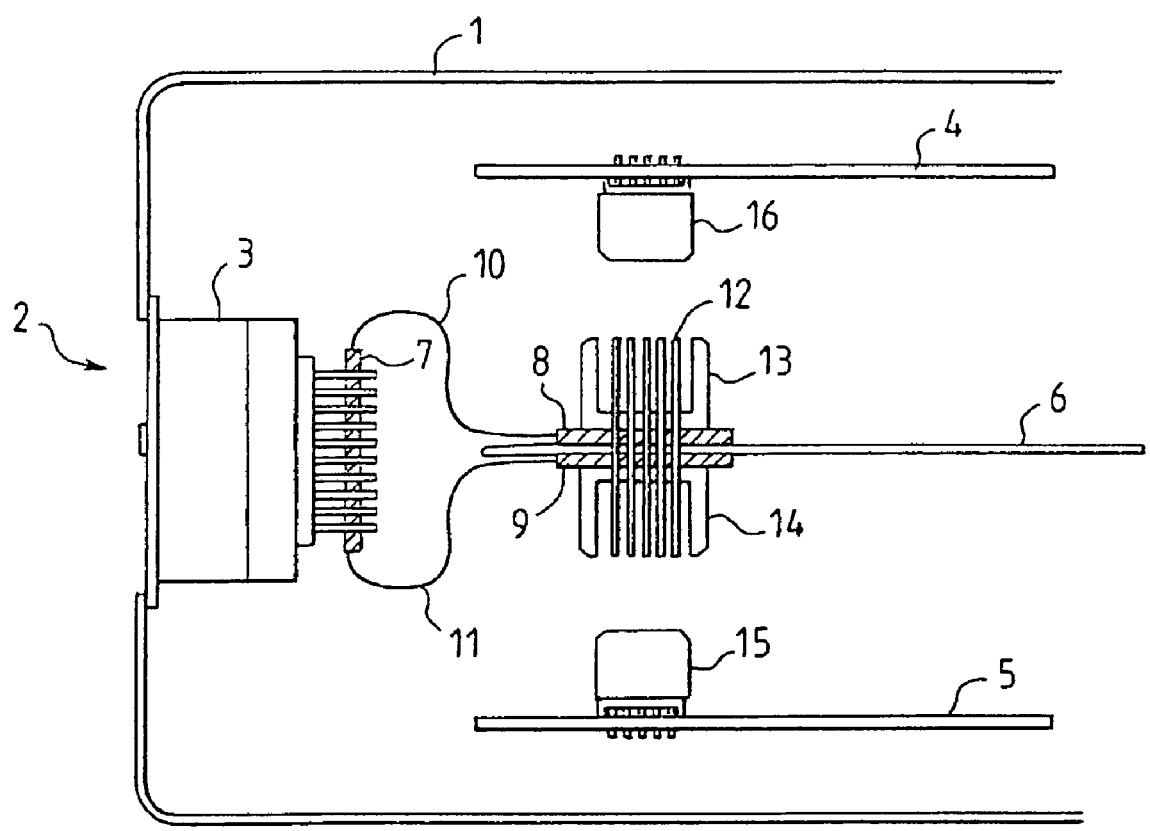

| | | |
|---|---|---|
| 5,396,401 A | 3/1995 | Nemoz |
| 5,423,080 A | 6/1995 | Perret et al. |
| 5,564,931 A * | 10/1996 | Fabian et al. ............. 439/62 |
| 5,742,484 A * | 4/1998 | Gillette et al. ........... 361/789 |
| 5,971,773 A | 10/1999 | Riddle |
| 6,031,730 A * | 2/2000 | Kroske ..................... 361/784 |
| 6,077,124 A * | 6/2000 | Etters et al. ............ 439/632 |
| 2005/0009382 A1 * | 1/2005 | Burmeister et al. ......... 439/67 |

* cited by examiner

INTERCONNECTING MODULE FOR THE BASE OF ELECTRONIC EQUIPMENT CASING

The present invention relates to interconnecting modules used in electronic device casings in order to electrically connect their printed circuit boards with one another and with the external environment. It relates more particularly to the interconnecting modules used as backplanes in detachable electronic device casings which are mounted detachably on supporting frames such as cradles, seats, cubicles or shelves etc. and equipped at the back with one or more semi-connectors designed to co-operate by being fitted together with semi-connectors of matching shape mounted on the supporting frames to electrically connect the electronic device, housed in the casings, with the external environment in which this device is designed to function.

The utility of detachable casings for electronic device lies in the fact that it facilitates maintenance and trouble-shooting for an electronic system, whose elements are distributed among several casings, by greatly simplifying replacement operations through the standard exchange of the casings. There are many sorts of known detachable casings. The trend is toward standardization, namely toward the utmost possible elimination of the specializing of casings as a function of the specific characteristics of connection of the printed circuit boards that they are designed to receive. This trend toward the standardization of the casings implies that the interconnecting modules used as backplanes enable all the printed circuit boards housed in a casing, without distinction, whatever the specific characteristics of the electronic device whose components they bear, to have a possibility of accessing all the points of connection of the casing with the external environment.

This constraint relating to the possibility of access of all the printed circuit boards housed in the casing to all the connection points of the casing with the external environment raises a problem of the space requirement of the interconnecting modules used on the backplane to set up an interface between the printed circuit boards housed in the casing and the semi-connectors mounted on the back of the casing once the number of connection points exceeds about a hundred. This is especially true as compactness is sought for the casings, which is often the case for devices designed to the incorporated into mobiles.

The present invention is aimed at obtaining an interconnecting module for a base of an electronic device casing, mounted on printed circuit boards, that is compact while at the same time allowing the casing to have a large number of electrical connection points with the outer environment accessible to all its printed circuit boards.

An object of the invention is an interconnecting module for a base of an electronic device casing that contains two groups of printed circuit boards bearing electronic device components, each group being constituted by one or more stacked printed circuit boards, and that has a back equipped with at least one field of contacts constituting electrical connection points accessible from the exterior of the casing. This interconnecting module provides for the transfer, at the level of the two groups of printed circuit boards, of the connection points of the casing accessible from the exterior. It comprises a field of electrical connection points transferred to the interior of the casing so as to be facing the two groups of printed circuit boards and tracks setting up the electrical links between this transferred field of connection points and the field of contacts with which the back of the casing is equipped. The module comprises a flat support in the form of a three-panel structure with:

a central panel, in printed circuit form, fixed to the back of the field of contacts of the connection points of the casing with the external environment, parallel to the back of the casing, and supporting the electrical connection tracks, on a portion of their paths starting from the contacts of this field of connection points with the external environment, said tracks being divided, on this portion of their paths, into at least two groups going towards opposite edges of the central panel, called longitudinal edges, and two side panels in printed circuit form, folded and placed flat against each other between the two groups of printed circuit boards, attached on either side of the central panel, each by an edge of one of the longitudinal edges of the central panel, by means of a linking part in the form of a flexible printed circuit having a size sufficient to enable them to be folded and placed flat against each other, sharing the transferred field of connection points and the linking tracks that lead thereto from the field of contacts of the connection points of the casing with the external environment, the transferred field of connection points being equipped with through-contacts, the connection points of the part of the transferred field borne by a side panel being shifted laterally with respect to the connection points of the matching part of the transferred field borne by the other side panel, the side panels supporting the connection tracks on the portion of their paths that leads to their part of the transferred field of connection points and being provided with at least one aperture leaving space for the through-contacts of the other side panel, the connecting tracks that lead to the part of the transferred field of connection points of a side panel passing, in order to meet contacts of the field of connection points accessible from the exterior of the casing, through the linking part attaching one of the edges of the side panel considered with one of the longitudinal edges of the central panel.

Advantageously, the central and side panels are rigid panels.

Advantageously, a metal shielding partition wall is interposed between the two side panels that are folded and placed flat against each other.

Advantageously, the two side panels are folded and placed flat against one another in parallel to a plane perpendicular to the central panel.

Advantageously, the two side panels are folded and placed flat against each other, in parallel and on either side of a plane perpendicular to the central panel, parallel to its longitudinal edges and passing through the middle of the central panel.

Advantageously, the ends of the through-contacts of the transferred field of connection points form pins for semi-connectors mounted back-to-back, on each side of the block constituted by the two side panels folded and placed flat against each other, designed to co-operate by fitting together with semi-connectors having matching shapes mounted on the printed circuit board of each of the two groups of printed circuit boards that directly face the two side panels.

Advantageously, the side panels are provided with an internal field of electrical connection points having no link with the contacts of the field of connection points with the environment outside the casing, borne by the central panel, the internal field of connection points comprising through-contacts forming pins of semi-connectors on the two opposite faces of the block constituted by the two side panels, folded and placed flat against each other, the pins of semi-connectors being designed to co-operate by fitting together with semi-connectors of matching shapes mounted on the printed circuit boards of each of the two groups of printed circuit boards that directly face the two side panels.

Advantageously, the semi-connectors mounted on each side of the block constituted by the two side panels folded and placed flat against each other comprise, without distinction, pins constituted by through-contacts belonging to the transferred field of connection points and to the internal field of connection points.

Advantageously, the part of the transferred field of connection points borne by a side panel is shifted laterally with respect to the matching part of the transferred field of connection points borne by the other side panel, each side panel comprising an aperture allowing passage to the part of the transferred field of connection points that is borne by the other side panel.

Advantageously, the semi-connectors equipping the block formed by the side panels folded and placed flat against each other have different thicknesses as a function of the side panel that supports them so that all are flush with the same level on each face of the block although the levels at which they are affixed depend on the side panel that supports them.

Advantageously, the side panels have dissymmetrical identical contours and are placed so as to be folded and positioned flat against each other so as to have non-coinciding contours.

Advantageously, the semi-connectors with matching shapes mounted on the printed circuit boards of each of the two groups of printed circuit boards that directly face the two side panels have pins consisting of through-contacts forming other pins, at their other end, for the semi-connectors mounted on the opposite face, reproducing the semi-connectors of the two side panels and making the fields of connection points of the side panels accessible to the next board of the printed circuit boards belonging to the same group.

Advantageously, the printed circuit boards of a group comprise through-contacts aligned with those of the fields of connection points borne by the side panels forming, on one face of the boards, pins of nestable semi-connectors having shapes that match the nestable semi-connectors of the side panels and, on the other face, nestable semi-connectors having the same shapes as the semi-connectors of the side panels so that, when they fit together, they make it possible, with the printed circuit boards of a group, to form a stack of printed circuit boards having access to all the connection points of the fields of connection points of the side panels.

Figure 2:
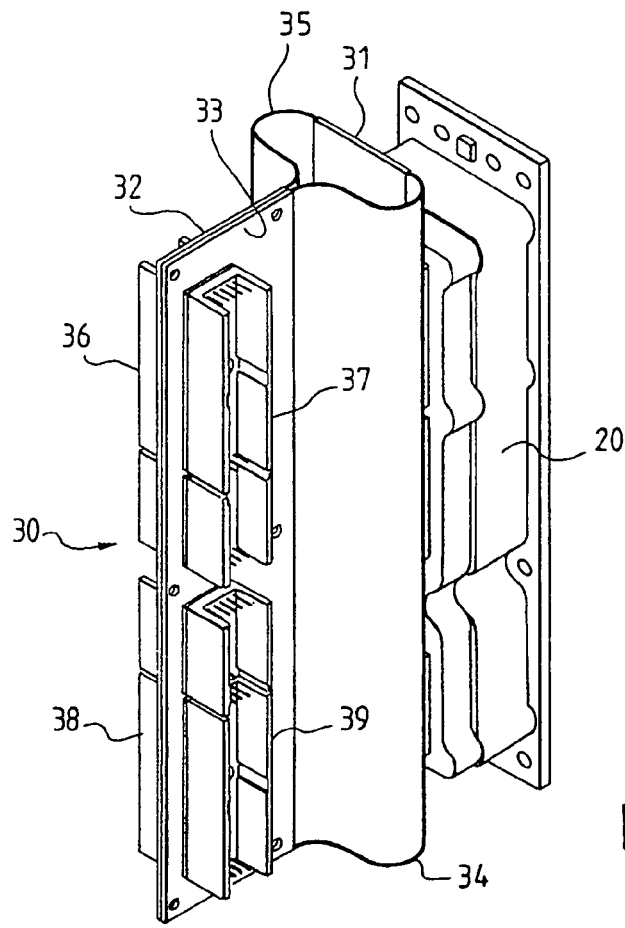
Figure 3:
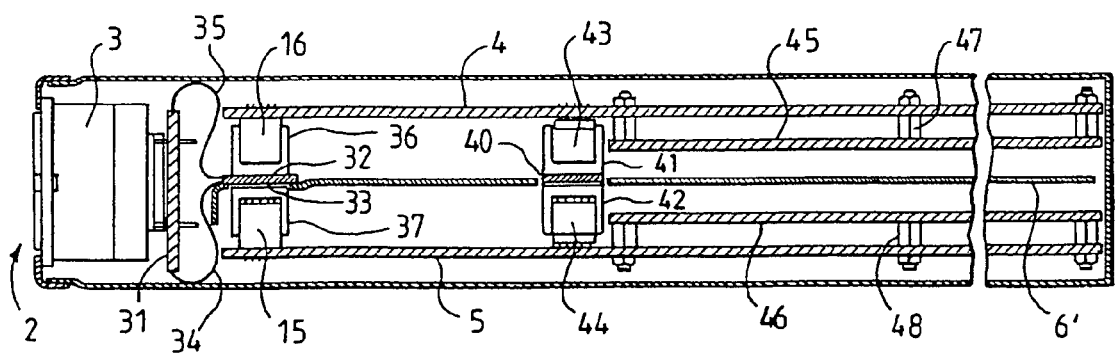
Figure 4:
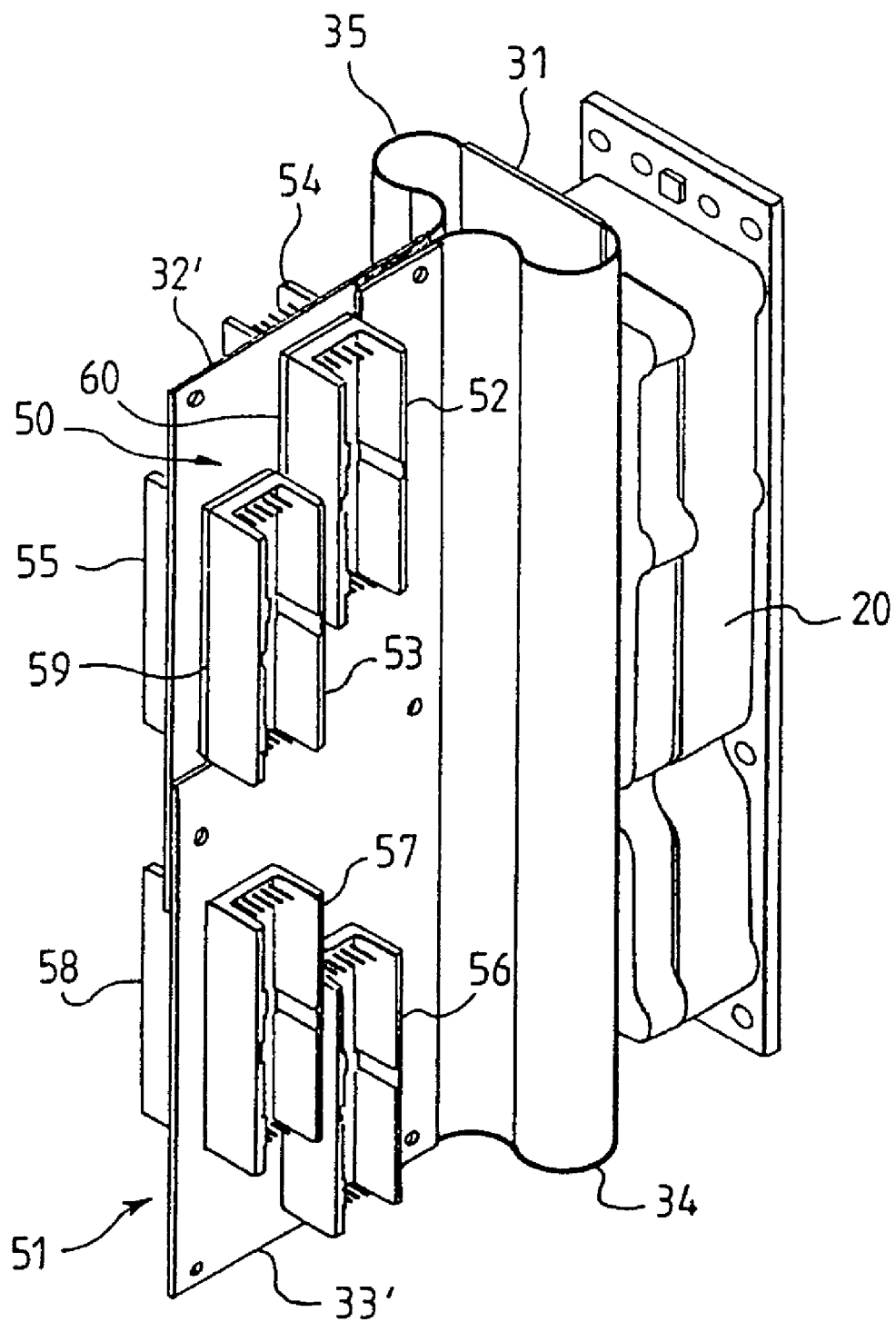

Other features and advantages of the invention shall appear from the following description of an embodiment given by way of an example. This description is made with reference to the appended drawing, wherein:

FIG. 1 is a drawing illustrating the architecture of an interconnecting module according to the invention and one of its possible arrangements within a casing, FIG. 2 is a view in perspective of an interconnecting module according to the invention mounted on the back of a semi-connector designed to equip the back of a casing to provide for the connections with the external environment, FIG. 3 is a view in section of a casing equipped with the interconnecting module illustrated in FIG. 2, and FIG. 4 is a view in perspective of another interconnecting module according to the invention.

FIG. 1 shows a sectional view of the rear part of an electronic device casing having the usual parallelepiped shape of a large book, with a casing 1 having an aperture 2 on the back of the casing, revealing a multiple-pin semi-connector 3 designed to fit into a semi-connector with a matching shape equipping a cradle designed to receive the casing.

The casing contains one or more electronic devices whose components are mounted on two printed circuit boards 4 and 5 positioned in parallel to the biggest faces of the casing and separated from each other by a metal shielding plate 6.

It is assumed that the electronic device or devices whose components are mounted on the printed circuit wafers 4, 5 exchange electrical signals with other electronic devices housed in other casings and therefore need to be connected with them through the environment external to the casing.

The multiple-pin, semi-connector 3 fixed to the back of the casing and accessible from the exterior fulfils this function of electric connection with the environment external to the casing, at the transition between the casing and its cradle. However, inside the casing, the connections are still to be made between the rear ends of the pins of the semi-connector 3 and the tracks of the printed circuit boards 4, 5 bearing the components of the device or devices housed in the casing.

The connections are generally made inside a casing, by means of a backplane board consisting of a single rigid printed circuit. This single rigid printed circuit is then fixed directly to the rear ends of the pins of the semi-connector 3 which are pointed to the inside of the casing, parallel to the back wall of the casing. Facing the edges of the printed circuit board supporting the components of the devices housed in the casing, this single rigid printed circuit is equipped with rows of nestable semi-connectors designed to get coupled with semi-connectors of matching shapes fixed to the edges of these boards and provided with a network of tracks setting up the necessary electrical links between the pins of the different semi-connectors.

Once the number of connecting points to be made becomes great, this manner of making the connections inside the casing, at the interface between the printed circuit boards of the electronic devices and the nestable semi-connector or semi-connectors fixed to the back of the casing and giving access to the external environment has a drawback. This drawback is that substantial space becomes necessary within the casing, in order to house the network of connectors setting up the electrical links at the edges of the printed circuit boards. Thus, it is not infrequent that it becomes necessary to provide for several hundreds of points of connection with the external environment, for example 400 to 600 connection points, on an electronic device casing. Thus, the casing must be designed to be far bulkier than would be the case for the simple housing of the printed circuit boards bearing the components of the electronic device placed in the casing. The result of this is a lack of compactness of the casings which often entails penalties for devices designed to be fitted into mobiles where space is very often costly.

A known way of restricting the space requirement of the backplane board of an electronic device casing consists achieving the utmost possible reduction in the number of internal connections that the board sets up, ensuring only indispensable connections. This amounts to customizing the casings according to the specific connection requirements of the types of printed circuit boards that these casings are effectively designed to contain. This runs counter to the present trend toward the standardization of the casings where it is sought, as far as possible, to avoid customizing casings according to the type of printed circuit board that they are designed to contain, since it is very rare for two types of boards to have the same connection requirements.

Here, an interconnecting module playing the role of the backplane board is proposed. This module enables all the printed circuit boards of a casing to have access to all the connection points of the casing with the external environment while at the same time being very compact. In this interconnecting module, the compactness is obtained by transferring the connections with the printed circuit boards 4, 5 that support the components of the electronic device housed in the casing from the edge of these components toward their flanks.

As shown in FIG. 1, the interconnecting module takes the form of a three-panel panel with a central panel 7 fixed to the back of the pins of the semi-connector 3 mounted on the real wall of the casing and two side panels 8, 9 joined by one side to the lateral edges of the central panel 7, by means of two flexible printed circuit 10, 11 folded and placed back-to-back against each other and fixed to the shielding partition wall 6.

More specifically, the central panel 7 is formed by a rigid printed circuit that is fixed, inside the casing, to the rear ends of the pins of the semi-connector 3 and bears electric linking tracks starting from the pins of the semi-connector 3 and separating into two groups toward its two opposite edges attached to the side panels 8, 9 by the flexible printed circuits 10, 11.

The side panels 8, 9 are formed by two rigid printed circuits folded and placed against each other back-to-back, perpendicularly to the central panel 7, on either side of the shielding partition wall 6, the flexible printed circuit 10, 11 having widths sufficient to enable this arrangement. They share, on the one hand, a transferred field of connection points which, facing the flanks of the printed circuit boards 4,5 supporting the components of the electronic device housed in the casing, reproduce the field of connection points with the external environment corresponding to the pins of the semi-connector 3 fixed to the back of the casing. On the other hand, they share the extensions of the electrical connection tracks coming from the central panel by means of the joining flexible printed circuits 10, 11.

The side panels 8, 9, as well as the shielding partition wall 6 at the side panels 8, 9 are drilled with networks of holes that correspond with each other and enable the passage of through-contacts 12 materializing the transferred field of connection points. Out of three aligned holes crossed by one and the same through-contact 12, only one made in one of the side panels is used as a destination for an electrical linking track with a contact pin of the semi-connector 3 fixed to the back of the casing, the other two holes, one made in the shielding plate 6 and the other in the other side panel being simple holes, either large enough to prevent any contact that could set up electrical transmission with the through-contact 12 or made with an insulating wall.

The two ends of the through-contacts 12 constitute pins for the nestable semi-connectors whose bases 13, 14 are fixed to the opposite flanks of the block constituted by the side panels 8, 9 folded and placed flat against each other back-to-back. These ends are directed toward semi-connectors 15, 16 having matching shapes, fixed to the facing faces of the printed circuit boards 4,5 bearing the components of the electronic device housed in the casing.

The electrical linking tracks which, on the side panels, end in the networks of holes provided with through-contacts 12 are distributed more or less equitably, on the two side panels 8, 9 and are divided into two groups with different paths passing through the two longitudinal edges of the central panel 7. This distribution facilitates the routing of the different electrical linking tracks since it doubles the possibility of designing tracks. This reduces the number of layers and hence the complexity of the printed circuits used for the central panels 7 and side panels 8, 9.

The making of the interconnecting module in the form of three rigid printed circuit panels joined by flexible printed circuits shall not be described in detail because it is known to those skilled in the art. In the context of multiple-layer printed circuits, the three-panel structure may be obtained at each layer, before the lay-up process and before the layers are fixedly joined together by bonding.

The use of a transferred field of connection points, electrically linked with the field of connection points of the casing with the external environment, reoriented from the edge to the flanks of the printed circuit boards bearing the components of the electronic device housed in the casing by means of an interconnecting module formed by folding printed circuits, makes it possible to take the space needed for the nestable connectors for connection with these printed circuit circuits. This space is taken not from the spacing between boards but on the surface of the boards, thus preserving the compactness of the casing. Indeed, the spacing between the printed circuit boards bearing the components of the electronic device housed in the casing is always small because of the small height of the components. The arrangement of the connectors on the edges of the boards necessarily dictates an increase in this pacing once the number of connection points to be made becomes great. This increase implies the poor use of the volume between boards. However, the arrangement of the semi-connectors on the surface of the boards results in only a small increase in the depth of the casing.

The transferred field of connection points may comprise a greater number of elements than the field of connection points with the external environment corresponding to the pins of the semi-connector 3 mounted on the back of the casing, the supernumerary elements being also equipped with through-contacts and constituting an internal field of connection points between the two printed circuit boards 4, 5 without any electrical links with the pins of the semi-connector 3 mounted on the back of the back.

It may be that the printed circuit boards 4, 5 are not isolated but form part of two stacks of boards. They are then also provided with through-contacts. The ends of these through-contacts that face the side walls 8, 9 constitute pins for the semi-connectors 15,16 designed to fit together with the semi-connectors 13, 14 of the side panels 8, 9. The opposite ends of these through-contacts having their back facing the side walls 8, 9 constitute pins for semi-connectors (not shown) that reproduce the semi-connectors 13,14 of the side walls 8, 9 for the next boards of the stack.

FIG. 2 gives a view in perspective of an exemplary embodiment of the interconnecting module shown schematically in FIG. 1. This module is mounted on the rear ends of the pins of a nestable semi-connector designed to be fixed to the back of the casing to provide for connections with the external environment of the casing. The body 20 of the nesting connector designed to be fixed to the back of the casing can be seen from the rear. The rear ends of the pins of this nesting connector fixed to the back of the casing are masked by the interconnecting module 30. The three-panel structure of this interconnecting module can be distinguished with its rigid central panel 31 coming above the body 20 of the connector, its two rigid side panels 32,33 folded and placed flat against each other in a plane perpendicular to the central panel 31 and the flexible printed circuits 34,35 joining each of the side panels 32,33 to a distinct longitudinal edge of the central panel 31.

The elongated, rectangular central panel 31 is positioned in parallel to the back of the casing, fixed to the rear ends of the pins of the semi-connector whose body 20 can be glimpsed.

The two side panels 32, 33, which have a same elongated rectangular contour here, are folded and placed flat against each other on either side of a plane perpendicular to the back of the casing passing through the longitudinal median line of the central panel 31 which is also that of the semi-connector fixed to the back of the casing, the flexible printed circuits 34,35 joining them by a longitudinal edge to the longitudinal edges of the central panel 31 having a width sufficient to enable this arrangement.

At a position shifted so as to be before the faces of the printed circuit boards housed in the casing, each side panel 32 and 33 reproduces the field of connection points with the external environment of the casing, embodied at the central panel 31 by the rear ends of the pins of the semi-connector fixed to the back of the casing. At the two side panels 31, 32, this transferred field takes the form of two networks of holes, one on each side panel 32 or 33. These two networks of holes get superimposed when the two side panels 32, 33 are folded and placed flat against each other. Through-contacts are threaded through these networks of holes. On each face of the block constituted by the two side panels 32,33 that are folded and placed flat against each other, these through-contacts serve as pins for nestable semi-connectors whose guide slots 36,37,38,39 can be seen. These pins are designed, as can be seen more clearly in FIG. 3, to co-operate with semi-connectors 15,16 of matching shapes that equip the two printed circuit boards 40, 41 housed in the casing.

As indicated here above, the network of pairs of aligned holes materializing the transferred field of connection points within the block constituted by the two side panels 32,33 folded and placed flat against each other is connected by electrical linking tracks to the field of connection points of the casing with the external environment, formed on the central panel 31 by the rear ends of the connection pins of the semi-connector fixed to the back of the casing. These tracks which cannot be seen in FIG. 2, are distributed more or less equitably between the two side panels 32 and 33, and the flexible printed circuits 34, 35 for joining the side panels 32, 33 to the central panel 31. On the side panel 32, 33 side, they lead to one of the holes of a pair occupied by a through-contact, the hole made on the side panels 32 or 33 bearing the track while the other hole belonging to the other side panel remains without any assigned track.

FIG. 3 is a cross-section view of a casing along its thickness. This casing repeats the main characteristics of the architecture described with reference to FIG. 1. It is paralleled-shaped with a rectangular-sectioned wall 1. It contains one or more electronic devices whose components are mounted on two printed circuit boards 4,5 placed flat on either side of a metal shielding partition wall 6' placed at the center of the casing. It is equipped with a multiple-pin nestable semi-connector 3 mounted in an aperture 2 of its back wall providing the electrical connections of the devices housed in the casing with the environment external to the casing and an interconnecting module forming the interface between this semi-connector 3 and the printed circuit boards 4, 5.

The interconnecting module is the one shown in FIG. 2, with its three-panel conformation. Its rigid central panel 31 is fixed to the rear ends of the pins of the semi-connector 3, parallel to the back wall of the casing. Its side panels 32 and 33, attached to the longitudinal edges of the central panel 31 by two flexible printed circuits 34, 35, are folded, placed flat against each other, fixed through an aperture of the shielding partition wall 6'. The block that they constitute supports nestable semi-connectors 36, 37 designed to co-operate with semi-connectors 16, 15 having matching shapes, mounted on the mutually facing sides of the printed circuit boards 4, 5 supporting the components of the electronic device housed in the casing.

The main difference with the interconnecting module shown schematically in FIG. 1 lies at the level of the block constituted by the two side panels 36, 37, folded and placed directly flat against each other and not on either side of the shielding plate. This difference in the mounting of the side panels 36, 37 facilitates the making of the casing since its shielding plate no longer has to present a network of individual holes for the through-contacts but only one general aperture. Above all, it facilitates the mounting of the through-contacts through the side panels 36, 37 since the block that they constitute no longer include the shielding plate.

Another difference consists of the presence, through an aperture of the shielding plate 6', of an insulating plate 40 supporting a field of through-contacts used as pins for nestable semi-connectors 41, 42 mounted on the opposite faces of the plate 40 and co-operating with semi-connectors 43, 44 having matching shapes fixed to the mutually facing sides of the printed circuit boards 4, 5 supporting the components of the electronic device housed in the casing. This field of through-contacts constitutes an internal field of connection points providing the electrical interconnection between the printed circuit board 4, 5, without relation with the field of connection points with the environment external to in the casing, taking the form of the pins of the semi-connector 3 fixed to the back of the casing.

Should the components mounted on the printed circuit boards 4, 5 have smaller heights than the connectors 16–36, 15–37, 41–43, 42–44, then the space imposed by the height of the connectors between the printed circuit boards 4, 5 and the shielding plate 6' can be occupied by an auxiliary printed circuit board 45, 46 placed in a mezzanine position by means of spacers 47, 48. These auxiliary boards 45, 46 may be connected to their carrier boards by wire connections or by flexible printed circuits.

FIG. 4 gives a view, in perspective, of another exemplary embodiment of the interconnecting module shown schematically in FIG. 1. This exemplary embodiment is close to the one described here above with reference to FIG. 2. It differs from that embodiment, however, in the shape of the contour of the side panels 32' and 33' which is no longer rectangular but has a large notch 50, 51. The two side panels 32' and 33' are folded and placed flat against each other so that their notches 50, 51 are not superimposed by allow the underlying face of the other side panel to be seen.

As above, at a position transferred so as to be before the printed circuit boards housed in the casing, the two side panels 32' and 33' reproduce the field of connection points with the external environment of the casing embodied at the central panel 31 by the rear ends of the pins of the semi-connector which is fixed to the back of the casing, its body being seen at 20 in FIG. 4. This transferred field of connection points is linked to the field of connection points with the external environment borne by the central panel 31, by means of electrical connection tracks divided between the two side panels 32', 33' and the flexible printed circuits 34, 35 joining them to the longitudinal edges of the central panel 31. This transferred field of connection points is again embodied by through-contacts whose ends act as pins for the nestable semi-connectors 52 to 58 mounted on the two faces of the side panels 32' 33'. However, unlike the embodiment of FIG. 2, the part of the transferred field of connection points borne by one of the side panels, 32' or 33' respectively, and the matching part of the transferred field of connection points borne by the other side panel, 33' or 32' respectively are no longer interlocked but geographically separated. In the block formed by the side panels 32' and 33', which are folded and placed flat against each other, the part of the transferred field of connection points borne by a side panel 32' or 33' takes up the place occupied by the notch of the other panel and vice versa. Thus, in FIG. 4, the part of the transferred field of connection points borne by the side panel 32' is embodied by the through-contacts constituting the pins of the semi-connectors 52 to 55 placed at the notch 50 of the side panel 33' while the matching part of the transferred field of connection points borne by the side panel 33' is embodied by the through-contacts constituting the pins of the semi-connectors 56 to 58 placed at the level of the notch 51 of the side panel 32'.

This assembly enables the semi-connectors 52 to 58 of the transferred field of connection points to be mounted individually on each side panel 32' and 33' and not on the block constituted by the two side panels folded and placed flat against each other. This has the advantage of eliminating the problems raised by control over the thickness of the block constituted by the two side panels folded and placed flat against each other during the mounting of the semi-connectors by automatic machines which carry out the installation of the accurate positioning elements of the semi-connectors and the force-fitting of the through-contacts forming their pins. By contrast, it is necessary to provide for thickness shims 59, 60 to bring about uniformity in the height of all the semi-connectors accessible by one and the same face of the block constituted by the two side panels 32', 33' folded and placed flat against each other.

It has been assumed, throughout the above description, that the entire field of connection points with the external environment external to the casing was relayed at the transferred field of connection points borne by the side panels of the interconnecting module. It goes without saying that these are connection points which may be of interest to one of the devices whose components are borne by the printed circuit boards housed in the casing. A certain number of connection points with the environment external to the housing, which are not of concern to these boards, are not relayed to the transferred field of contacts but directly wired to other circuits, often accessory circuits, mounted outside these printed circuit boards.

What is claimed is:

1. An interconnecting module for the base of an electronic device casing including two groups of printed circuit boards bearing electronic device components, each group having one or more stacked printed circuit boards, and that has a back equipped with a field of contacts constituting electrical connection points accessible from the exterior of the casing, said interconnecting module providing for the transfer, at the level of the two groups of printed circuit boards, of the connection points of the casing accessible from the exterior, comprising a field of electrical connection points transferred to the interior of the casing so as to be facing the two groups of printed circuit boards and tracks setting up the electrical links between this transferred field of connection points and the field of contacts with which the back of the casing is equipped, comprising:

a central panel in printed circuit form, fixed to the back of the field of contacts of the connection points of the casing with the external environment, parallel to the back of the casing, and supporting the electrical connection tracks, on a portion of their paths starting from the contacts of this field of connection points with the external environment, said tracks being divided, on this portion of their paths, into at least two groups going towards opposite edges of the central panel, called longitudinal edges, and two side panels in printed circuit form, folded and placed flat against each other between the two groups of printed circuit boards, attached on either side of the central panel, each by an edge of one of the longitudinal edges of the central panel, by means of a linking part in the form of a flexible printed circuit having a size sufficient to enable them to be folded and placed flat against each other, sharing the transferred field of connection points and the linking tracks that lead thereto from the field of contacts of the connection points of the casing with the external environment, the transferred field of connection points being equipped with through-contacts, the connection points of the part of the transferred field borne by a side panel being shifted laterally with respect to the connection points of the matching part of the transferred field borne by the other side panel, the side panels supporting the connection tracks on the portion of their paths that leads to their part of the transferred field of connection points and being provided with at least one aperture leaving space for the through-contacts of the other side panel, the connecting tracks that lead to the part of the transferred field of connection points of a side panel passing, in order to meet contacts of the field of connection points accessible from the exterior of the casing, through the linking part attaching one of the edges of the side panel considered with one of the longitudinal edges of the central panel.

2. The module according to claim 1, wherein the central and side panels are rigid panels.

3. The module according to claim 1, adapted to a casing comprising a metal shielding partition wall between the two groups of printed circuit boards characterized in that said metal shielding partition wall interposed between the two side panels that are folded and placed flat against each other.

4. The module according to claim 1, wherein the two side panels are folded and placed flat against each other in parallel to a plane perpendicular to the central panel.

5. The module according to claim 1, wherein the two side panels are folded and placed flat against each other, in parallel and on either side of a plane perpendicular to the central panel, parallel to the longitudinal edges of this central panel and passing through its middle.

6. The module according to claim 1, wherein the ends of the through-contacts of the transferred field of connection points form pins for semi-connectors mounted back-to-back, on each side of the block constituted by the two side panels folded and placed flat against each other, designed to co-operate by fitting together with semi-connectors having matching shapes mounted on the printed circuit board of each of the two groups of printed circuit boards that directly face the two side panels.

7. The module according to claim 1, wherein the side panels are provided with an internal field of electrical connection points having no link with the contacts of the field of connection points with the environment outside the casing, borne by the central panel, said internal field of connection points comprising through-contacts forming pins of semi-connectors on the two opposite faces of the block constituted by the two side panels, folded and placed flat against each other, these pins of semi-connectors being designed to co-operate by fitting together with semi-connectors of matching shapes mounted on the printed circuit board of each of the two groups of printed circuit boards that directly face the two side panels.

8. The module according to claim 7, wherein the semi-connectors mounted on each side of the block constituted by the two side panels folded and placed flat against each other comprise, without distinction, pins constituted by through-contacts belonging to the transferred field of connection points and to the internal field of connection points.

9. The module according to claim 1, wherein the part of the transferred field of connection points borne by a side panel is shifted laterally with respect to the matching part of the transferred field of connection points borne by the other side panel, each side panel comprising an aperture allowing passage to the part of the transferred field of connection points that is borne by the other side panel.

10. The module according to claim 9, wherein the semi-connectors equipping the block formed by the side panels folded and placed flat against each other have different thicknesses as a function of the side panel that supports them so that all are flush with the same level on each face of the block although the levels at which they are affixed depend on the side panel that supports them.

11. The module according to claim 10, wherein the differences in thickness imposed on the semi-connectors equipping the block constituted by the side panels folded and placed flat against each other, so that they are flush at the same level, are obtained by means of thickness shims.

12. The module according to claim 9, wherein the side panels have identical dissymmetrical contours and are placed so as to be folded and positioned flat against each other so as to have non-coinciding contours.

13. The module according to claim 1, wherein the semi-connectors equipping the block constituted by the side panels folded and placed flat against each other co-operate with the semi-connectors of matching shapes mounted on the printed circuit boards of each of the two groups of printed circuit boards coming into a position that directly faces the two side panels whose pins are constituted by through-contacts forming, at their other end, other pins for the semi-connectors mounted on an opposite face reproducing the semi-connectors of the two side panels and making the fields of connection points of the side panels accessible to the next printed circuit board belonging to the same group.

14. The module according to claim 13, wherein the printed circuit boards of a group comprising through-contacts aligned with those of the semi-connectors borne by the side panels, forming, on one face of the board, pins of nestable semi-connectors with shapes matching the nestable semi-connectors of the side panels and, on the other face, nestable semi-connectors having the same shapes as the semi-connectors of the side panels so that, in fitting together, they make it possible, with the printed circuit boards of a group, to form a stack of printed circuit boards having access to all the connection points of the fields of connection points of the side panels.

* * * * *